United States Patent [19]
Humphreys et al.

[11] Patent Number: 5,736,904
[45] Date of Patent: Apr. 7, 1998

[54] AUTOMATIC TRIMMING OF A CONTROLLED OSCILLATOR IN A PHASE LOCKED LOOP

[75] Inventors: Scott R. Humphreys, Boynton Beach; Darrell E. Davis, Sunrise, both of Fla.

[73] Assignee: Motorola, Inc., Schaumburg, Ill.

[21] Appl. No.: 753,833

[22] Filed: Dec. 2, 1996

[51] Int. Cl.$^6$ .................................................. H03L 7/08
[52] U.S. Cl. ........................ 331/10; 331/14; 331/16; 331/25; 331/34; 331/44
[58] Field of Search .......................... 331/10, 14, 16, 331/25, 34, 44

[56] References Cited

U.S. PATENT DOCUMENTS

| | | | |
|---|---|---|---|
| 4,896,122 | 1/1990 | Tahernia et al. | 331/158 |
| 4,929,918 | 5/1990 | Chung et al. | 331/10 |

*Primary Examiner*—Siegfried H. Grimm
*Attorney, Agent, or Firm*—Eduardo Guntin; John H. Moore

[57] ABSTRACT

A PLL circuit (401), including a VCO (420) having a trimming port (418) and a tuning port (416), a PLL controller (404), a variable voltage source (408), a voltage measuring circuit (426) and a multiplexer (412, 414, 428), performs automatic trimming of the VCO (420). The PLL circuit (401) accomplishes this by initiating a trimming mode that controls the multiplexer so that it couples the output of the PLL controller (404) to the trimming port (418), and the output of the variable voltage source (408) to the tuning port (416), thereby to phase lock the VCO (420) to the reference frequency signal (421). The PLL circuit (401) then measures, by way of the voltage measuring circuit (426), a voltage at the trimming port (418), switches the PLL circuit (401) to an operational mode, and then adjusts the variable voltage source (408) to be substantially equal to the voltage measured.

13 Claims, 5 Drawing Sheets

TUNING
102
104
TRIMMING
106
108
VCOout
110

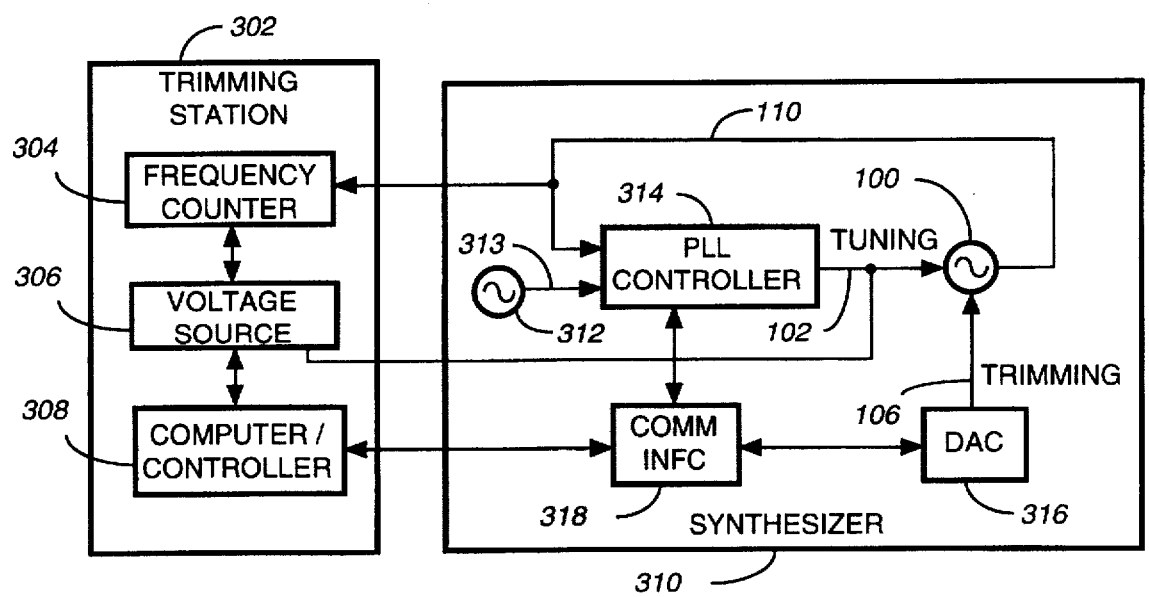
FIG. 3 *Prior Art*
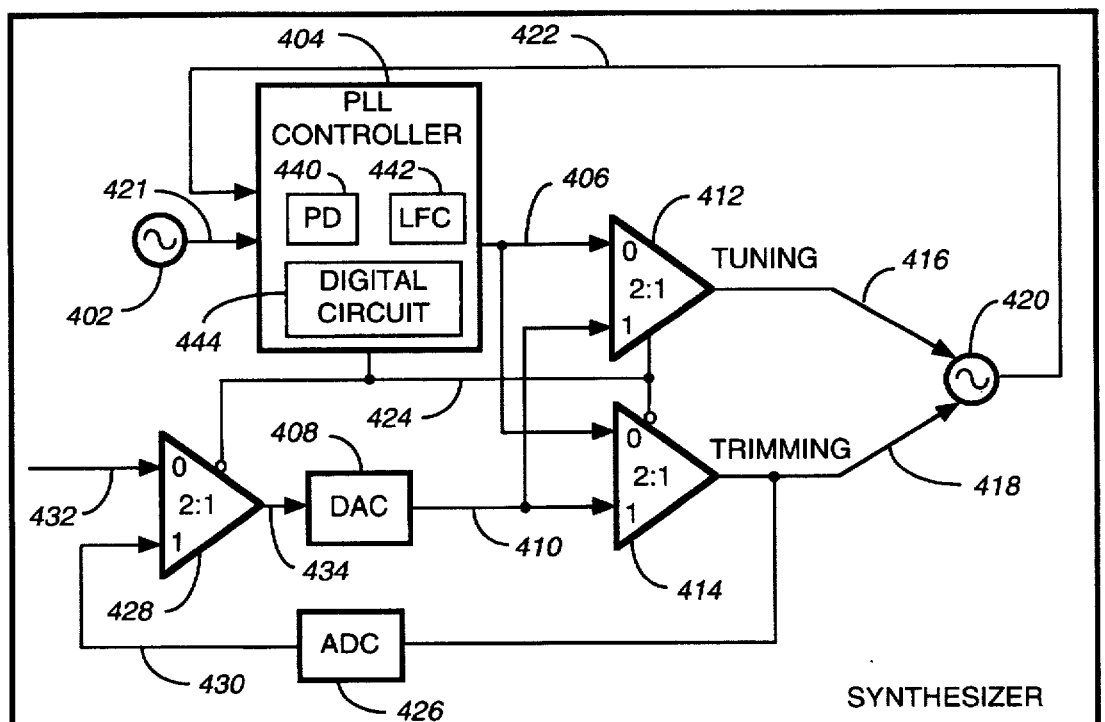
FIG. 4

AUTOMATIC TRIMMING OF A CONTROLLED OSCILLATOR IN A PHASE LOCKED LOOP

FIELD OF THE INVENTION

This invention relates in general to frequency synthesizer circuits, and particularly to a method and apparatus for trimming a variable-controlled oscillator.

BACKGROUND OF THE INVENTION

In general, it is desirable for a synthesized selective call receiver (SCR) to cover as wide a frequency range ("band-split") as possible. This allows for increased flexibility for service providers that wish to cover wide areas with many different frequencies using a roaming or scanning protocol.

The useful frequency range of a synthesized SCR is limited by the tuning characteristics of the voltage-controlled oscillator (VCO) and other tuned networks in the radio, such as the antenna and preselector. It is important that the VCO tank circuit be trimmed to offset any tolerance variations in the discrete components.

Because mechanical and laser trim capacitors require expensive custom tooling equipment for trimming the VCO during production, a preferable method chosen by some in the communications industry is an electronic tuning method. This method generally includes the use of varactors in place of mechanical or laser trim capacitors. In these applications, the varactors' tuning voltages are generally set by a digital-to-analog converter (DAC). The DAC is programmed to generate a varactor DC bias for setting a trimming capacitance of the VCO.

During production, trimming of the VCO requires the use of test equipment such as a frequency counter, a voltage source, and a computer to operate the test station. The frequency counter and the voltage source are controlled by the computer and interface with the synthesizer circuit of the SCR to trim the VCO circuit. The interface is generally accomplished by using a mechanical fixture with probing pins which make contact with the necessary components of the synthesizer circuit.

Trimming a VCO circuit with the use of a test station such as this has several drawbacks. First, the frequency probe utilized by the frequency counter to measure the output frequency of the VCO is usually in a critical portion of the VCO and buffer circuitry. This requires additional care and cost in the fixture and board design to minimize any effects on the VCO and accompanying circuitry. Second, the frequency counter is typically slow requiring a long gate time for an accurate measurement. Long gate times result in the need for more test stations to maintain an adequate manufacturing throughput, which in turn increases manufacturing costs significantly. Third, in order for the computer to perform the trim process effectively, a significant effort in custom programming of the computer is required to arrive at an efficient trim algorithm. And lastly, the large number of relatively slow interactions between the computer, test hardware, and the synthesizer (e.g., repeated adjustment and measurement steps) also adds to the test time.

In sum, what is needed is a method and apparatus that overcomes the manufacturing difficulties encountered by prior art trimming systems. In particular, a method and apparatus is needed that reduces VCO trim time, and utilizes the least amount of test equipment.

BRIEF DESCRIPTION OF THE DRAWINGS

FIG. 3 is an electrical block diagram depicting a prior art production test station for programming the VCO circuit of FIG. 1;

FIG. 4 depicts a frequency synthesizer including a phase-locked loop (PLL) circuit with automatic trimming of a VCO circuit according to the present invention;

DESCRIPTION OF THE PREFERRED EMBODIMENT

Figure 1:
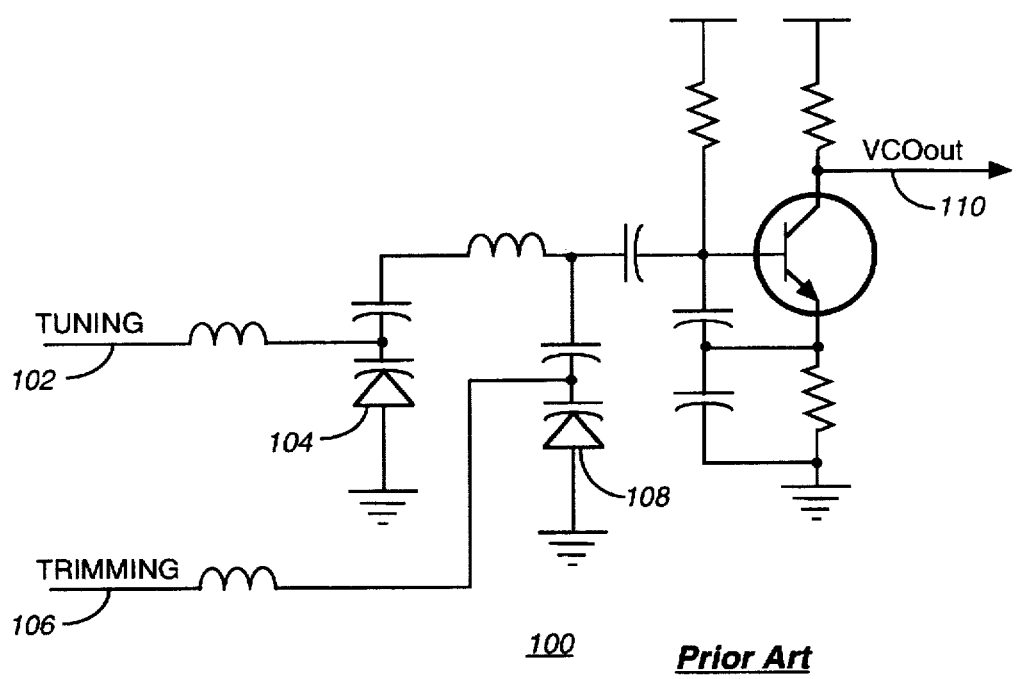
FIG. 1 is an electrical block diagram of a prior art VCO circuit.

FIG. 1 is an electrical block diagram of a prior art VCO circuit 100 for generating a controlled frequency output (VCO output 110). This circuit is a conventional VCO circuit utilizing two varactors 104, 108, which are independently programmed by a tuning port 102 and a trimming port 106, respectively. In prior art PLL circuits, the tuning port 102 is controlled by a PLL controller (see FIG. 3) for performing adjustments to the VCO circuit 100 during a normal phase lock loop operation. The trimming port 106, on the other hand, is controlled during the manufacturing process with an external voltage source such as, e.g., a digital-to-analog converter (DAC) (see FIG. 3).

Figure 2:
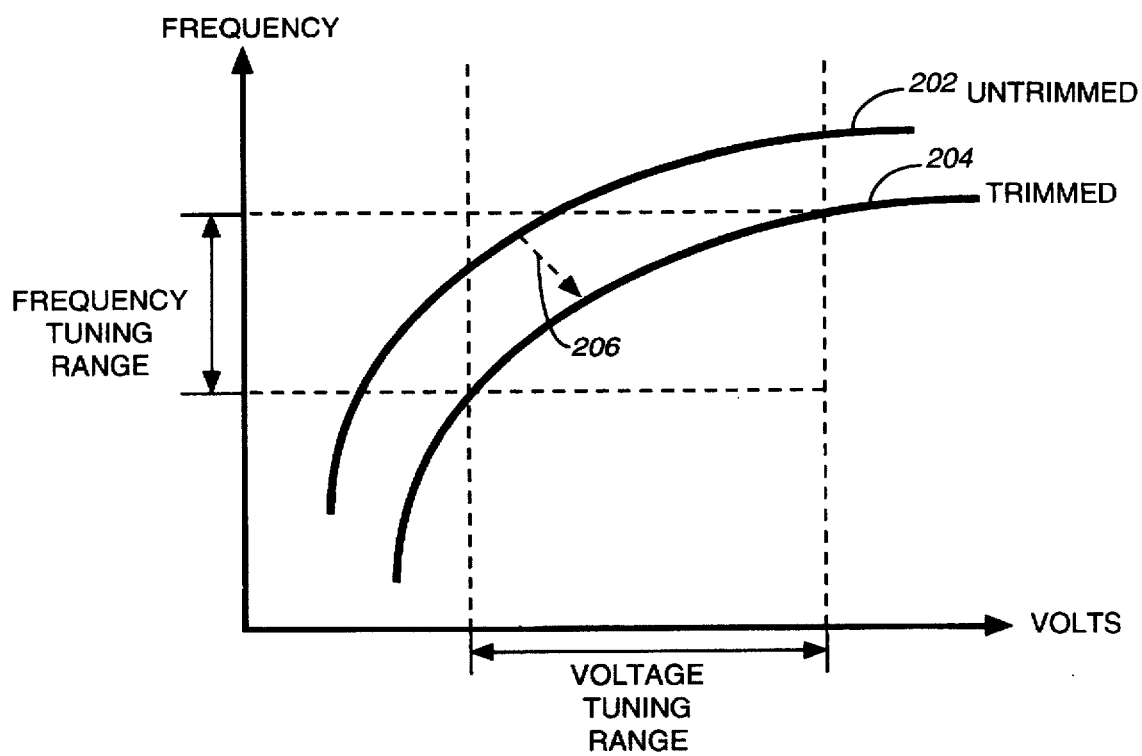
FIG. 2 is a graph depicting a frequency-to-voltage transfer function of an untrimmed and trimmed VCO circuit.

FIG. 2 is a graph 200 depicting a frequency-to-voltage transfer function of an untrimmed and trimmed VCO circuit. VCO circuits are generally made to operate with a frequency tuning range, which in turn corresponds to a voltage tuning range (i.e., the tuning range of the varactor 104). An untrimmed VCO circuit commonly has a transfer function 202 which is not centered within the frequency tuning range. During the trimming process, the VCO's transfer function is shifted to a nominal operating position 206 (i.e., centered) such as is shown by transfer function 204. Once the transfer function of the VCO has been centered, the VCO circuit 100 is ready for normal PLL operation.

FIG. 3 is an electrical block diagram depicting a prior art production test station 300 for programming the VCO circuit of FIG. 1. The prior art system comprises a trimming station 302 and a synthesizer circuit 310 coupled thereto for trimming purposes. The synthesizer 310 comprises a PLL controller 314 coupled to a reference oscillator 312 for generating a reference frequency signal 313, the VCO circuit 100 of FIG. 1, a communications interface 318, and a DAC 316.

The PLL controller 314 generates as an output a loop error signal, which is representative of a frequency error detected between the VCO output 110 and the reference frequency signal 313. The output of the PLL controller 314 is coupled to the tuning port 102. The DAC 316 is coupled to the trimming port 106 for trimming the VCO circuit 100. Once the trimming process is complete, the DAC 316 remains programmed to a predetermined voltage indefinitely during the operation of the synthesizer 310. The communication interface 318 is a conventional digital communications interface such as, for example, a Serial Peripheral Interface (SPI) commonly known to those of ordinary skill in the art. During the trimming process, the purpose of the SPI is to disable the PLL controller 314 for direct access to the VCO circuit 100, and to program the DAC 316 during the trimming process.

The trimming station 302 comprises a frequency counter 304, a voltage source 306, and a computer 308 used for operation and control of the hardware of the test station 300, and the synthesizer 310. Before starting the trimming process, the computer 308 initializes the frequency counter 304, and the voltage source 306. The computer 308 then communicates with the synthesizer 310 by way of the communications interface 318, to disable operation of the PLL controller 314. Once the PLL controller 314 is disabled, the VCO output 110 and the tuning port 102 is each probed physically with probe pins attached to a test fixture.

The tuning port 102 is then held by the voltage source 306 at a constant predetermined voltage (e.g., half-scale operating voltage of the VCO circuit 100), and the frequency of the VCO output 110 is measured by the frequency counter 304. During the trimming process, the computer 308 programs the DAC 316 by way of the communications interface 318 to different values until the VCO frequency is within a predetermined frequency range (e.g., approximately the mid-range point of the VCO operating frequency range of FIG. 2). Once the VCO frequency is within the predetermined frequency range, the last value programmed into the DAC 316 is stored in a memory element of the synthesizer 310 (not shown) to program the DAC 316 indefinitely.

The trimming process of the synthesizer 310 just discussed is slow and costly. FIG. 4 depicts a frequency synthesizer 400 including a phase-locked loop (PLL) circuit 401 that overcomes the disadvantages of this prior art production system. In particular, FIG. 4 shows a PLL circuit 401 that performs automatic trimming of a controlled oscillator (CO) according to the present invention. The PLL circuit 401 comprises a VCO circuit 420 having as inputs a trimming port 418 and a tuning port 416, and as an output a controlled frequency signal 422. The VCO circuit 420 is substantially similar to the prior art design of FIG. 1; therefore, design details will not be discussed further.

The PLL circuit 401 further includes a PLL controller 404, a reference oscillator circuit 402 for generating a reference frequency signal 421, a DAC 408 utilized as a variable voltage source, an ADC (analog-to-digital converter) 426 utilized as a voltage measuring circuit, and two conventional two-to-one analog multiplexers 412, 414, and one conventional two-to-one digital multiplexer 428. The multiplexers 412, 414, 428 are preferably implemented with conventional transmission gates.

The PLL controller 404 comprises a conventional phase detector 440 circuit, a conventional loop filter circuit 442 and a digital circuit 444. The phase detector 440 is coupled to the reference frequency signal 421 and the controlled frequency signal 422 for generating a phase error signal, which is processed by the loop filter circuit 442 for generating the loop error signal 406. The digital circuit 444 is preferably a conventional digital controller comprising an algorithmic state machine, which is used for controlling the operation of the PLL circuit 401. It will be appreciated that, alternatively, the PLL circuit 401 can be controlled by an external controller, such as a test station, that is not an integral portion of the PLL circuit 401, as will be discussed for FIG. 6.

As shown, the output 410 of the DAC 408, and the output 406 of the PLL controller 404 are multiplexed with the tuning port 416 and the trimming port 418. The multiplexing operation is accomplished by multiplexers 412 and 414 which are coupled to the tuning port 416 and the trimming port 418, respectively, each multiplexer being controlled by the mode signal 424, which is generated by the digital circuit 444. In addition, multiplexer 428 selects between a trim initialization signal 432 and the output 430 of the ADC 426 which is coupled to the trimming port 418 for making a voltage measurement therefrom. The trim initialization signal 432, as will be described shortly, is hardcoded to a specific digital word.

Before discussing the operation of the synthesizer 400 of the present invention, it is worth noting that a substantial difference between the present invention and the prior art is that the prior art requires the assistance of a trimming station 302 for trimming a VCO circuit, while the present invention does not. That is, the present invention provides a method and apparatus for trimming the VCO circuit 420 automatically without intervention by an external controller, such as trimming station 302.

It will also be appreciated that, alternatively, the VCO circuit 420 discussed above can be replaced with a conventional current-controlled oscillator (ICO) circuit. Under this application, the PLL controller 404 and the DAC 408 are current source circuits rather than voltage source circuits.

Figure 5:
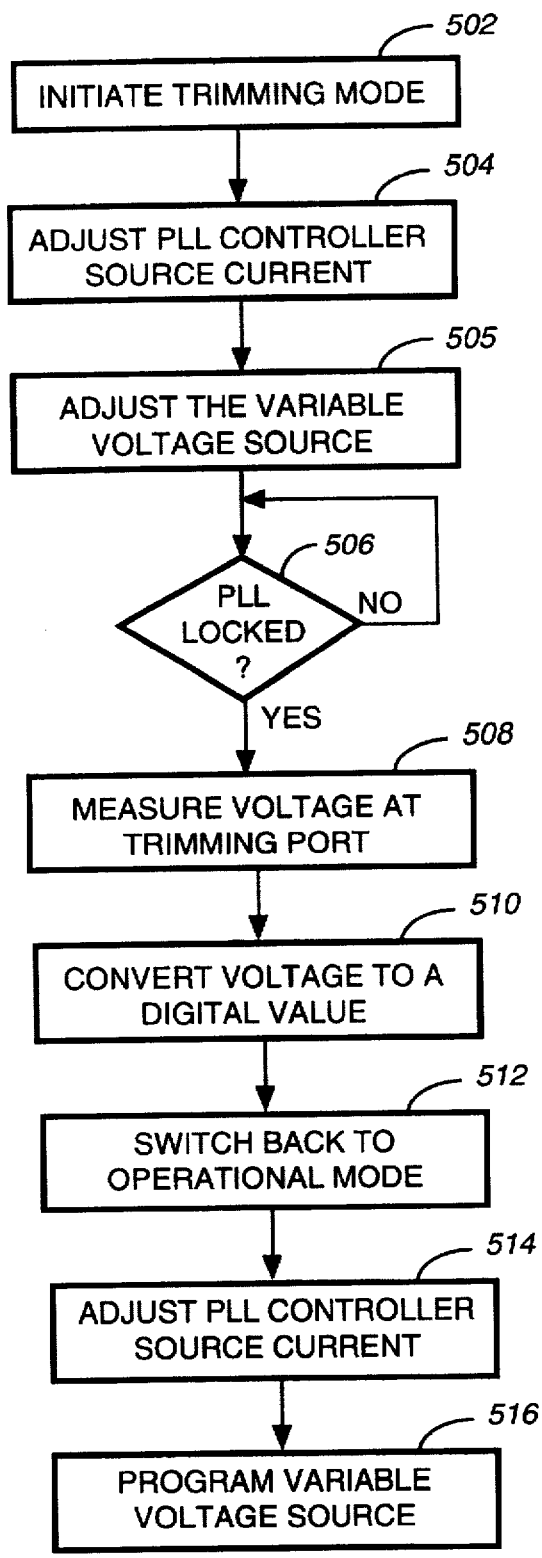
FIG. 5 is a flow chart depicting the operation of the PLL circuit according to the present invention.

FIG. 5 is a flow chart 500 depicting the operation of the PLL circuit 401 for performing automatic trimming of the VCO circuit 420 according to the present invention. The programming steps that follow are preferably accomplished by the PLL controller 404. In addition, the programming steps below are performed preferably once in the normal operation of the PLL circuit 401.

The trimming process is limited to one cycle by programming the PLL controller 404 to detect the presence of a power-on signal, and to thereafter check whether the VCO circuit 420 has been previously trimmed. The power-on signal is generated, for example, by a conventional reset circuit (not shown in FIG. 4) that activates when power is applied to the PLL circuit 401. Determining the trimming status of the VCO circuit 420 is accomplished by checking the state of a digital flag stored in a conventional non-volatile memory (e.g., EEPROM not shown in FIG. 4). The digital flag bit is programmed once by the PLL controller 404 to a true state after the VCO circuit 420 has been previously trimmed.

Lastly, the one-time automatic trimming cycle is preferably performed during the manufacturing process so that defective PLL circuits 401 can be repaired before being released to the field. It will be appreciated that, alternatively, the PLL controller 404 can be programmed to allow forced trimming of the VCO circuit 420 for field repair.

Referring back to the flow chart 500, the trimming process begins with an initialization step 502 that places the PLL circuit 401 in a trimming mode. This is accomplished by setting the mode signal 424 to a logic high level (i.e., "1"), which in turn connects the input to port 1 of multiplexer 412 and the input to port 0 of multiplexer 414 (note that the select line to multiplexer 414 is inverted) to the tuning port 416 and the trimming port 418, respectively. With these selections, the tuning port 416 is driven by the output 410 of the DAC 408, and the trimming port 418 is driven by the output 406 of the PLL controller 404.

Generally, the gain of the trimming port 418 and the gain of the tuning port 416 are not the same. Because of this, in step 504, the PLL controller 404 is programmed to adjust the loop gain to match the gain of the trimming port 418. It will be appreciated that, alternatively, when the gain of the trimming port 418 and the gain of the tuning port 416 are substantially the same, steps 504 and 514 are not necessary.

Once step 504 has been completed, the trimming process continues to step 505 where the DAC 408 is programmed to a voltage representative of a desired operating voltage (e.g., half-scale operating voltage) of the VCO circuit 420. Since the mode signal 424 is high, the input of the DAC 408 is driven by the trimming initialization signal 432. The trimming initialization signal 432 provides a digital value used for programming the DAC 408. This signal comprises a signal bus of, for example, eight signal lines (for an 8bit DAC 408), which are fixed to a digital value representative of the half-scale operating voltage of the tuning port 416 of the VCO circuit 420.

Once the DAC 408 has been programmed, the trimming process proceeds to step 506 where a wait period is invoked until the VCO circuit 420 has phase locked with the reference frequency signal 421. This is accomplished by, for example, the PLL controller 404 detecting that the loop error signal 406 is at a constant predetermined range. Once the signals are phase locked, the trimming process proceeds to step 508 where the voltage at the trimming port 418 is measured by the ADC 426. In step 510, the ADC 426 generates a digital value 430 representative of this voltage, which is received by multiplexer 428. The ADC 426 maintains this value indefinitely at the input of multiplexer 428 by storing the digital value in the non-volatile memory discussed above. Storing the digital value in this memory occurs preferably once the PLL controller 404 has detected phase lock.

It will be appreciated that, alternatively, where a non-volatile memory is not available, the trimming process can be invoked every time the PLL circuit 401 is powered on.

In step 512, the PLL circuit 401 is switched back to an operational mode. This is accomplished by setting the mode signal 424 to a low value (i.e., "0"), which in turn results in coupling output 406 of the PLL controller 404 to the tuning port 416, and output 410 of the DAC 408 to the trimming port 418 by way of multiplexers 412, 414. In step 514 the PLL controller 404 adjusts the source current of output 406 to match the gain of the tuning port 416. As noted above, this step is not necessary if the gain of the trimming port 418 and the gain tuning port 416 are substantially the same. Finally, in step 516 the DAC 408 is programmed with the digital value 430 generated by the ADC 426. After completing this step, the PLL circuit 401 is fully operational.

As is evident, the present invention provides significant advantages over the prior art production system in FIG. 3. First, there is essentially no need for a trimming station when utilizing the PLL circuit 401 of the present invention. Second, the trimming process is limited only to the lock time of the PLL circuit 401. Generally, the PLL circuit 401 will lock in 30 ms or less, while the prior art system in FIG. 3 requires 30 seconds or more for trimming the VCO. Thus, the present invention provides a substantial reduction in the need for multiple test stations 300, and potentially improves manufacturing throughput over the prior art by up to a 1000 fold. Yet another advantage of the present invention over the prior art is that the additional circuitry (i.e., the multiplexers 412, 414, 428, and the ADC 426) required to achieve the objective of the present invention is negligible in cost when integrated into an IC.

Figure 6:
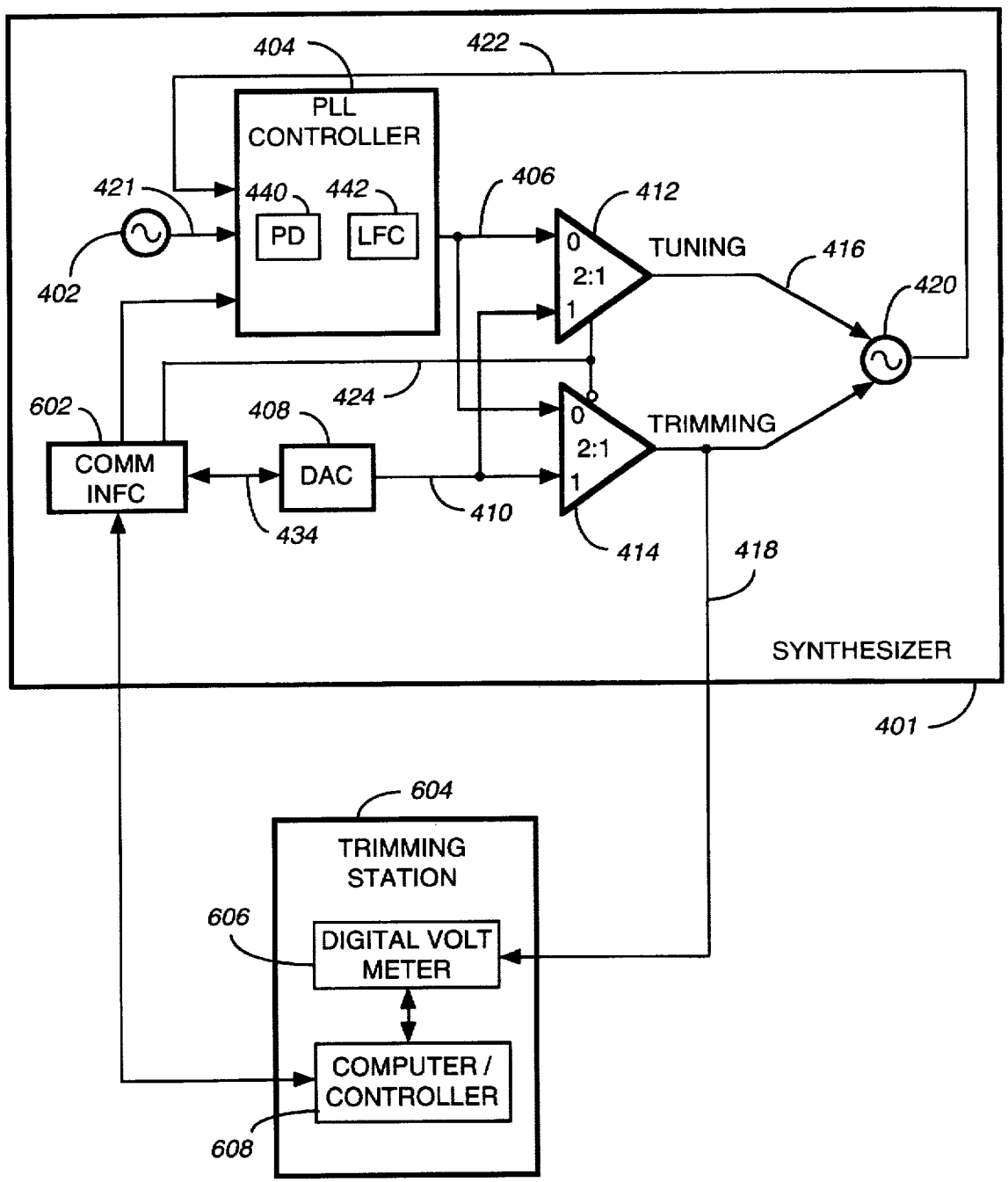
FIG. 6 depicts a phase-locked loop (PLL) circuit trimmed by a test station according to the present invention.

It will be appreciated that, alternatively, the PLL circuit 401 can be simplified by removing multiplexer 428 and ADC 426. FIG. 6 illustrates this alternative embodiment, where a test station 604 comprising a conventional DVM (digital volt meter) 606 and a computer 608 is utilized for the trimming process. The DVM 606 is used for measuring the trim voltage at the trimming port 418. Under this manufacturing environment, only one test point on the trimming port 418 is required for DVM access (in contrast to two test points for the prior art system of FIG. 3), and a communications interface 602 (such as the one described for FIG. 3) is required for programming the DAC 408 under the control of the computer 608. This method of production is still significantly faster than the prior art system of FIG. 3, because the PLL controller 404 is still being utilized in conjunction with the VCO circuit 420 as a phase lock loop trimming process. Hence, the trim process remains in the millisecond range, and is advantageously fast.

Figure 7:
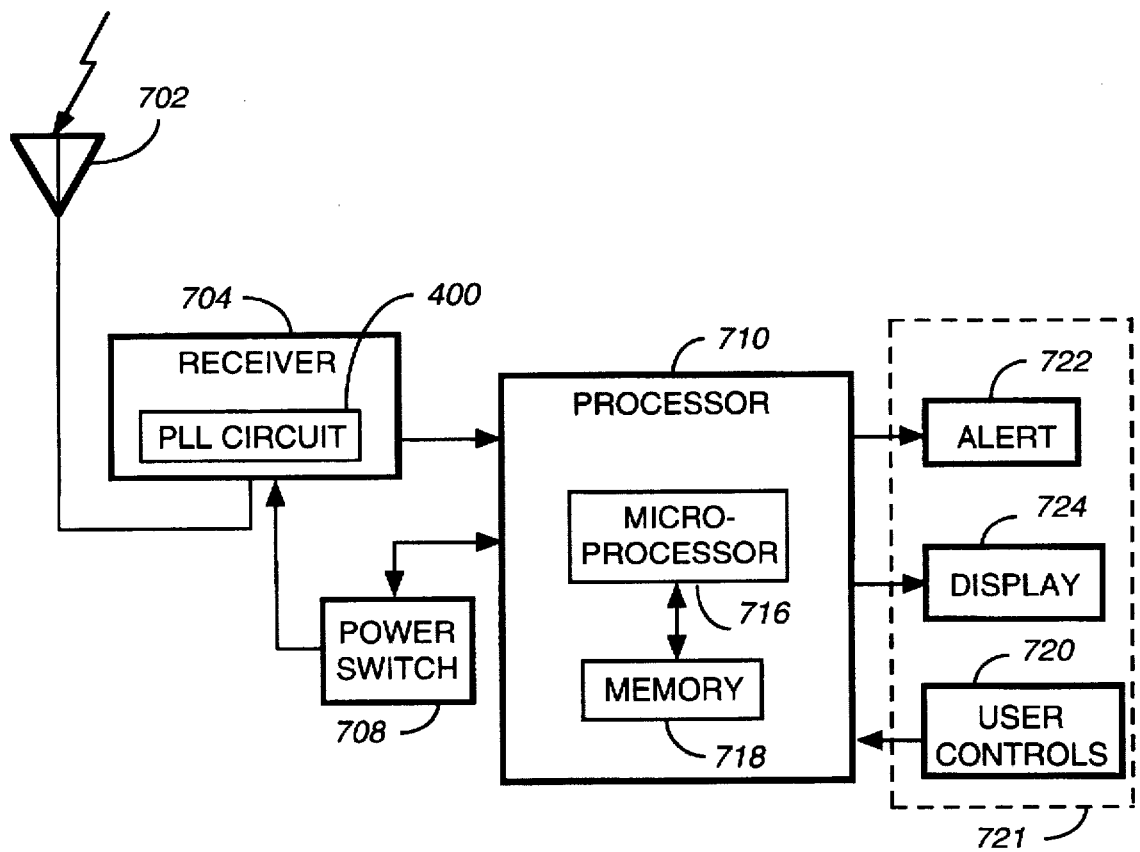
FIG. 7 is an electrical block diagram of a selective call receiver (SCR) utilizing the PLL circuit of FIG. 4.

FIG. 7 is an electrical block diagram of a selective call receiver (SCR) 700 utilizing the PLL circuit 401 of FIG. 4. The SCR 700 comprises a receiving circuit 704 coupled to a conventional antenna 702, a power switch 708, a processor 710, and a user interface 721. The receiving circuit 704 and antenna 702 are utilized for receiving messages transmitted by a radio communication system. The receiving circuit 704 includes the PLL circuit 401 described above. The PLL circuit 401 is used by the receiving circuit 704 as a synthesizer circuit for providing the oscillator injection signal(s) to the front-end mixer circuits (not shown) of the receiving circuit 704. It will be appreciated that, additionally, the PLL circuit 401 can be used to provide a clock signal to the microprocessor 716. By utilizing the PLL circuit 401 of the present invention, the receiving circuit 704 can be manufactured at a low cost, and at a high manufacturing rate.

The power switch 708 is a conventional switch, such as a MOS (metal oxide semiconductor) switch for controlling power to the receiving circuit 704 under the direction of the processor 710, thereby providing a battery saving function.

The processor 710 is used for controlling operation of the SCR 700. Generally, its primary function is to decode and process demodulated messages provided by the receiving circuit 704, store them and alert a user of the received message. To perform this function, the processor 710 comprises a conventional microprocessor 716 coupled to a conventional memory 718 having nonvolatile and volatile memory portions, such as a ROM (read-only memory), EEPROM (electrically erasable programmable read only memory), and RAM (random-access memory). One of the uses of the memory 718 is for storing messages received from the radio communication system. Yet another use is for storing one or more selective call addresses utilized in identifying incoming personal or group messages to be intercepted by the SCR 700. Note that the memory 718 may also be utilized for storing the digital value 430 discussed above.

Once a message has been decoded and stored in the memory 718, the processor 710 activates the alerting device 722 (included in the user interface 721) which generates a tactile and/or audible alert signal to the user. The user interface 721, which further includes, for example, a conventional LCD display 724 and conventional user controls 720, is utilized by the user for processing the received messages. This interface provides options such as reading, deleting, and locking of messages.

To communicate messages to the SCR's 700, the radio communication system preferably utilizes a protocol such as the FLEX protocol, developed by Motorola, Inc. (FLEX is a trademark of Motorola, Inc.) for transmitting synchronous messages. The FLEX protocol is a digital selective call signaling protocol that is presently used by various system operators in the United States and in several other countries. It will be appreciated that, alternatively, other signaling protocols that are suitable to the present invention can be used.

In sum, because of the manufacturing advantages provided by the PLL circuit 401 of the present invention, the throughput of manufacturing SCR's 700 is substantially greater than that provided by prior art manufacturing systems. Moreover, utilizing a fully automated PLL circuit 401, such as described for FIG. 4, would be helpful in expediting introduction of new SCR's 700 into the consumer market, because of the small effort required in developing a manufacturing process for such a circuit.

What is claimed is:

1. For a controlled oscillator (CO) in a phase locked loop (PLL) circuit having an operational mode in which a PLL controller receives a reference frequency signal and generates an output coupled to a tuning port of the CO, and a variable voltage source is coupled to a trimming port of the CO, a method for tuning the CO, comprising:

initiating a trimming mode of the PLL circuit by coupling the trimming port to the output of the PLL controller, and coupling the tuning port to the variable voltage source;

adjusting the variable voltage source to a voltage representative of a desired operating voltage of the CO, thereby to phase lock the CO to the reference frequency signal;

measuring a voltage at the trimming port upon achieving phase lock;

switching the PLL circuit back to the operational mode; and adjusting the variable voltage source to be substantially equal to the voltage measured.

2. The method as recited in claim 1, wherein the step of switching from the trimming mode and the operational mode is accomplished by multiplexing the output of the PLL controller and the output of the variable voltage source to the trimming port and the tuning port of the CO.

3. The method as recited in claim 1, wherein the step of measuring the voltage includes the step of converting the voltage to a digital value.

4. The method as recited in claim 3, wherein the variable voltage source is programmed with the digital value after switching the PLL circuit back to the operational mode.

5. A phase locked loop (PLL) circuit, comprising:

a controlled oscillator (CO) having as inputs a trimming port and a tuning port, and as an output a controlled frequency signal;

a PLL controller coupled to a reference frequency signal and the controlled frequency signal for generating as an output a loop error signal;

a variable voltage source;

a multiplexer for switching the output of the PLL controller and an output of the variable voltage source between the trimming port and the tuning port; and a voltage measuring circuit coupled to the trimming port, the PLL controller programmed to:

initiate a trimming mode by controlling the multiplexer so that it couples the loop error signal to the trimming port, and the output of the variable voltage source to the tuning port;

adjust the variable voltage source to a voltage representative of a desired operating voltage of the CO, thereby to phase lock the CO to the reference frequency signal;

measure by way of the voltage measuring circuit a voltage at the trimming port upon achieving phase lock;

switch the PLL circuit back to an operational mode by controlling the multiplexer so that it couples the loop error signal to the tuning port, and the output of the variable voltage source to the trimming port; and adjust the variable voltage source to a voltage that is substantially equal to the voltage measured.

6. The PLL circuit as recited in claim 5, wherein the CO comprises a voltage-controlled oscillator (VCO).

7. The PLL circuit as recited in claim 5, wherein the CO comprises a current-controlled oscillator (ICO).

8. The PLL circuit as recited in claim 5, wherein the voltage measuring circuit comprises an analog-to-digital converter.

9. The PLL circuit as recited in claim 5, wherein the PLL controller comprises:

a phase detector coupled to the reference frequency signal and the controlled frequency signal for generating a phase error signal;

a loop filter circuit coupled to the phase error signal for generating the loop error signal; and a digital circuit for controlling operation of the PLL circuit.

10. The PLL circuit as recited in claim 5, wherein the variable voltage source comprises an digital-to-analog converter.

11. The PLL circuit as recited in claim 5, further comprising a communication circuit for receiving programming information from an external source.

12. A selective call receiver comprising the PLL circuit of claim 5.

13. A phase locked loop (PLL) circuit, comprising:

a controlled oscillator (CO) having as inputs a trimming port and a tuning port, and as an output a controlled frequency signal;

a PLL controller coupled to a reference frequency signal and the controlled frequency signal for generating as an output a loop error signal, the PLL controller comprising:

a phase detector coupled to the reference frequency signal and the controlled frequency signal for generating a phase error signal, a loop filter circuit coupled to the phase error signal for generating the loop error signal, and a digital circuit for controlling operation of the PLL circuit;

a digital-to-analog converter;

a multiplexer for multiplexing the loop error signal and an output of the digital-to-analog converter between the trimming port and the tuning port; and an analog-to-digital converter coupled to the trimming port, the PLL controller programmed to:

initiate a trimming mode by controlling the multiplexer so that it couples the loop error signal to the trimming port, and the output of the digital-to-analog converter to the tuning port;

adjust the digital-to-analog converter to a voltage representative of a desired operating voltage of the CO, thereby to phase lock the CO to the reference frequency signal;

measure by way of the analog-to-digital converter a voltage at the trimming port upon achieving phase lock;

switch the PLL circuit back to an operational mode by controlling the multiplexer so that it couples the loop error signal to the tuning port, and the output of the digital-to-analog converter to the trimming port; and adjust the digital-to-analog converter to a voltage that is substantially equal to the voltage measured.

* * * * *